United States Patent [19]

Jeschke et al.

[11] Patent Number: 4,903,596
[45] Date of Patent: Feb. 27, 1990

[54] SYSTEM FOR INDICATING SETTINGS OF INK FEED FOR PRINTING

[75] Inventors: Willi Jeschke, Heidelberg; Hugo Rambausek, Wiesloch, both of Fed. Rep. of Germany

[73] Assignee: Heidelberger Druckmaschinen AG, Heidelberger, Fed. Rep. of Germany

[21] Appl. No.: 96,595

[22] Filed: Sep. 14, 1987

Related U.S. Application Data

[63] Continuation of Ser. No. 834,652, Feb. 27, 1986, abandoned, which is a continuation of Ser. No. 612,304, May 21, 1984, abandoned, which is a continuation-in-part of Ser. No. 478,290, Mar. 24, 1983, abandoned, which is a continuation of Ser. No. 211,580, Dec. 1, 1980, abandoned, which is a continuation of Ser. No. 55,914, Jul. 9, 1979, abandoned.

[30] Foreign Application Priority Data

Jul. 8, 1978 [DE] Fed. Rep. of Germany ....... 2830085

[51] Int. Cl.$^4$ .......................... B41F 7/24; B41F 31/04
[52] U.S. Cl. ..................................... 101/148; 101/365; 101/485
[58] Field of Search ............... 101/365, 148, 351, 350, 101/DIG. 26; 340/753, 762, 754, 722, 328, 331

[56] References Cited

U.S. PATENT DOCUMENTS

| | | | |
|---|---|---|---|
| 3,644,784 | 2/1972 | Dickey et al. ...................... | 340/753 |
| 3,689,835 | 9/1972 | Bickford ........................... | 340/753 X |
| 3,726,250 | 4/1973 | Merk ................................. | 340/754 X |
| 3,772,874 | 11/1973 | Lefkowitz ........................ | 340/753 X |
| 3,925,770 | 12/1975 | Beacham et al. ................ | 340/328 X |
| 3,930,447 | 1/1976 | Murray .............................. | 101/365 |
| 3,987,392 | 10/1976 | Kugelmann et al. ............ | 340/753 X |
| 4,014,011 | 3/1977 | Ashkin ............................... | 340/754 |
| 4,155,084 | 5/1979 | Klees .................................. | 340/753 |

FOREIGN PATENT DOCUMENTS

2744946 4/1979 Fed. Rep. of Germany ...... 340/753

Primary Examiner—J. Reed Fisher
Attorney, Agent, or Firm—Herbert L. Lerner; Laurence A. Greenberg

[57] ABSTRACT

A display system for a rotary printing press for displaying the inking profile on an LED matrix. The profile indication is provided by means of a time shared display with control circuit which scans the positions of all the ink control members, all having position sensors, and sequentially accesses an analog-to-digital converter with decoded outputs which are converted to a number of LED columns, each represented by a continuously lighted LED the coarse position of the ink control member. A fine position indication may be provided by simultaneously showing a fine indication by means of a flash LED in the corresponding column. A still finer indication may be provided by means of a second flashing LED in the corresponding column.

18 Claims, 8 Drawing Sheets

SYSTEM FOR INDICATING SETTINGS OF INK FEED FOR PRINTING

BACKGROUND

This is a continuation of Application Ser. No. 834,652, filed Feb. 27, 1986, now abandoned, which was a continuation of Application Ser. NO. 612,304, filed May 21, 1984, now abandoned, which was a continuation-in-part of Application Ser. No. 478,290, filed Mar. 24, 1983, now abandoned, which was a continuation of Application Ser. No. 211,580, filed Dec. 1, 1980, now abandoned, which was a continuation of Application Ser. No. 055,914, filed July 9, 1979, now abandoned.

The invention relates to a method of indicating settings of remote-controlled, zonal control members for metering a supply of ink and/or dampening solution at a central remote-control console of a rotary printing press, the settings being converted into display signals which are rendered visible by light-emitting diodes associated with respective inking and/or dampening zones so that they represent the inking and/or dampening profile.

In the course of further advances made in automation measures on printing presses for reducing the burden on operating personnel as well as to shorten set-up times, it is known to vary the ink feed to the individual inking zones by means of control members associated with the individual inking zones of an inking unit.

As has been described in "Heidelberg News" 3/35, Volume 1977 and in a brochure entitled "Heidelberg Offset CPC" issued at the "Drupa" 1977, it is advantageous for controlling such control members to indicate the so-called inking profile at the central remote-control console of the printing press in the form of an analog display. The position with respect to a zero line of individual activated light-emitting diodes corresponding to the ink-layer thickness of the respective inking zones, defines the so-called inking profile over the width of the remote-control console, providing the operating personnel with qualitatively valuable information with respect to the momentary state of inking.

In many cases wherein demands imposed upon the quality of the printed product are not too high, this relatively accurate information regarding the inking is sufficient, especially in cases where limited accuracy of the indication of the ink layer thickness has to be expected anyway, for example, due to the low degree of resolution of the settings for the inking profile, especially since the determination of the setting such as, for example, the position of an inking zone screw or the location of a given point on the ink knife with respect to a fixed coordinate, does not actually represent the ink layer thickness.

The development of advanced control members representing the real ink layer thickness, as had been achieved for example in the remote-control unit "Heidelberg Offset CPC", means that the foregoing method of detecting the precise inking profile over the width of the press is not longer adequate. The improved reproducibility and the greater resolution of the settings for the inking profile attainable as a result make it possible to provide for sufficient accuracy in the display so as to be able to utilize the advantages of these new control systems to their full extent.

However, in no way is it possible to dispense with the analog indication of the inking profile since this continues to provide the operating personnel with a valuable item of information, even if the contribution it makes, although not negligible, is unsatisfactory for adjusting the ink feed of the individual inking zones, especially where hight demands are placed on the ink quality of the printed product. Increasing the number of individual, zonal light-emitting diodes is maybe obvious; this, however, cannot remedy the situation since, for example, even a doubling of the number of light-emitting diodes is sufficient for the required accuracy of indication, especially since the space required therefor is not usually available at the central remote-control console. Thus, certain limits are imposed in improvement in the accuracy of heretofore known analog displays for reading therefrom fractions of existing indication values.

SUMMARY:

It is according an object of the invention to provide, in addition to the previously existing analog indication of the inking profile, a method of fine indication which, at relatively little expense, provides further precise information regarding the fine adjustment state of the ink feed to the individual zones and which indicates this information to the operating personnel in a clear and precise manner, so that the information regarding the ink feed is complete.

The thus presented objective is achieved in accordance with the invention in that the same display signals are used for two separate displays of which one is in the form of a coarse analog display of the inking and/or dampening profile, providing the base value for the settings for the coarse adjustment of the control elements, and the other in the form of a fine digital display, indicating the fractional value for the settings for the fine adjustment of the control elements.

The invention provides, at relatively little technical effort, a method for indicating information which consists of a base part which may be indicated in integer form and a small fractional, remaining part, wherein the base information indicates the inking and/or dampening profile in analog form, and simultaneously, the remaining information is indicated in digital form, for a fine adjustment of the individual inking and/or dampening zone members that is still within the possibility of the control members to the degree of resolution and reproducibility of the control elements.

In order to attain a clear separation between the rough and the fine displays for the base part and for the fractional, remaining respectively for the purpose of achieving improved clarity when reading the indications, the rough analog display is provided by means of vertical, zonal rows of light-emitting diodes and the fine digital display is provided by means of a digital signalling device additionally assigned to each row of light-emitting diodes.

A possible manner of advantageously performing the method according to the invention provides that the two displays, both the rough-analog first display as well as the fine-digital second display to be effected by the zonal light-emitting diodes, the fine-digital display is superimposed upon the rough-analog display in the zonal columns of light-emitting diodes. This method of indication makes use of the previously existing LED display for representing the inking profile. The simultaneous use of the column of light-emitting diodes both for the rough as well as for the fine display dispenses entirely with any additional, separate display, as well as with any associated electronics. This results in considerable cost savings.

In order to differentiate readily between the two displays when superimposed, the rough-analog display is effected by continuously illuminating individual light-emitting diodes of the corresponding zonal columns, and the fine-digital display by simultaneously flashing some of the corresponding light-emitting diodes of the corresponding individual zonal columns.

In accordance with a further mode of the method according to the invention, if one of the display signals exceeds the response threshold of a light-emitting diode of one of the columns of zonal light-emitting diodes, the fractional value of the display signal lying between the latter response threshold and the response threshold of the next higher light-emitting diode and which cannot be shown in the analog display is fed to a fine digital display. Due, for example, to a decimal fine division of the spacing of a pair of light-emitting diodes respectively disposed above one another with successive integer numbers, a greater display accuracy of the settings and thereby greater adjustment accuracy of the zonal control elements is attained.

An exemplary device for performing the method of the invention includes vertical columns of light-emitting diodes provided for the coarse analog display of the inking and/or dampening profile as the base value for the settings of the coarse adjustment of the control elements, and digital indicating devices which provide the fine digital display for indicating the fractional values of the display signals that cannot be shown in the analog display.

Such an arrangement device permits the operating personnel to have not only a rapid and comprehensive view of the actually existing inking profile as analog information, but also delivers simultaneously digital information regarding the fine adjustment state of the individual zonal inking and/or dampening control elements, whereby actions in the form of fine corrections can be effected in the inking and/or dampening-solution feed in order to achieve high printing quality in the shortest time.

In accordance with a further feature of the invention, the digital signalling devices are constructed as numerical displays associated with each of the zonal columns of light-emitting diodes and are positioned thereabove. In these numerical displays, the fractional (intermediate) values of the setting between two consecutive light-emitting diodes are made clearly visible to the operating personnel in the form of decimals, for example, which is of considerable advantage when great qualitative demands are made upon the accuracy of the printed product.

Furthermore, the possibility arises that the same vertical columns of light-emitting diodes provide both the coarse analog display of the inking and/or dampening profile as base value for the settings of the coarse adjustment of the control elements as well as the fine digital display for indicating the fractional values of the display signals that cannot be shown directly in the analog display and whereby constantly illuminating light-emitting diodes are used for the coarse analog display and flashing light-emitting diodes for the fine digital display superimposed on the coarse analog display.

Despite cost saving attained by combination of the two display modes by using the same columns of light-emitting diodes in one indicating device, the printer can, within a very brief time, obtain a clear overview, broken down into rough and fine information, of the inking and/or dampening profile and the need for corrective adjustments of the inking and/or dampening control members.

Other advantageous features of the invention are contained in the following description and in the appended claims.

The invention is further explained hereinafter in its basic embodiment represented in part in the drawings as well as in two further embodiments.

DESCRIPTION OF THE PREFERRED EMBODIMENT

Figure 1:
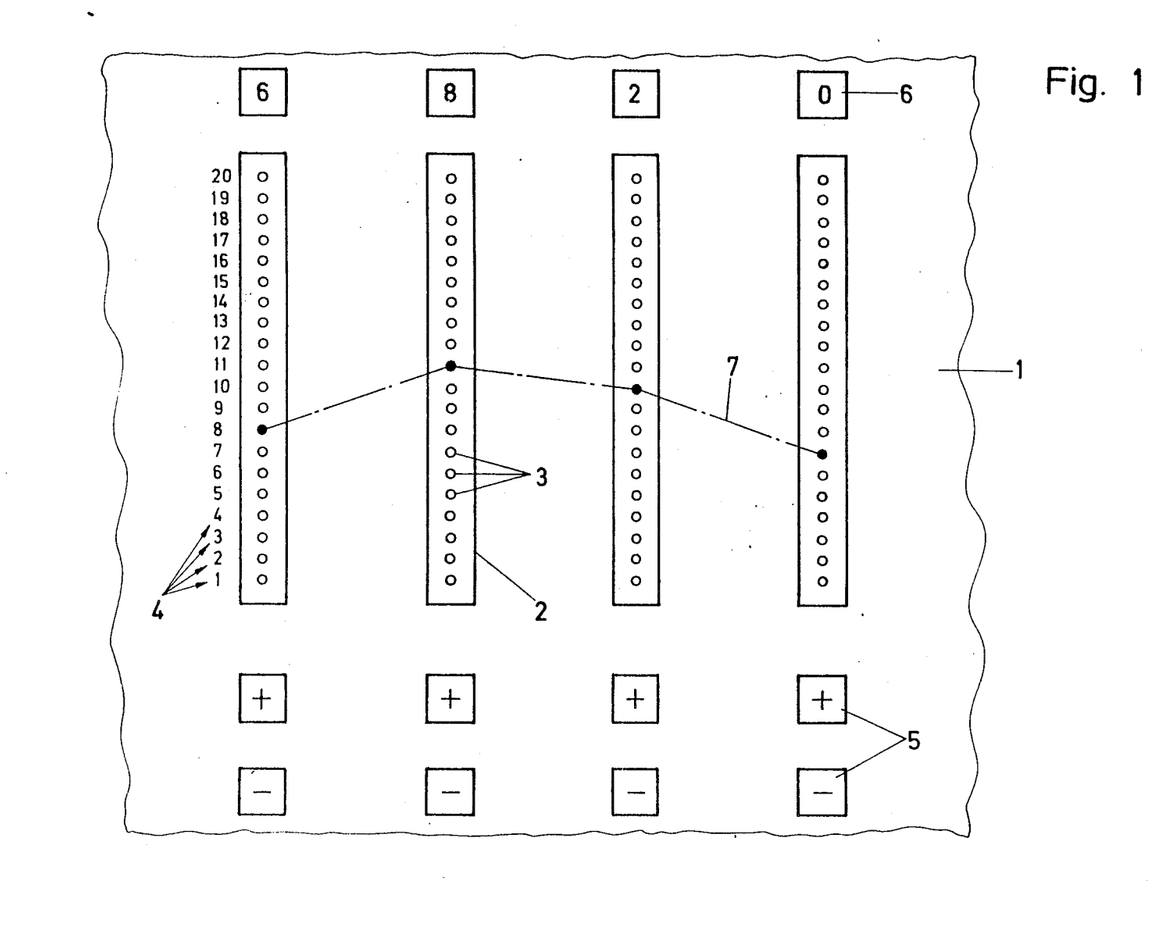
FIG. 1 is a diagrammatic, fragmentary, elevational view of a basic construction of an indicating device for indicating settings according to the invention.

FIG. 1 shows part of a control desk 1 of a central remote-control console, showing individual inking zones of an inking unit which is conventional and therefore not further illustrated and described. Zonal light-emitting diode displays in the form of vertical columns 2 of light-emitting diodes have, depending upon the desired indicating accuracy, a number of light-emitting diodes 3 with vertically increasing interger numbers 4 which are assigned to (associated with) each inking zone. In the basic embodiment according to FIG. 1, a vertical column 2 of light-emitting diodes comprises twenty individual light-emitting diodes 3 positioned one above the other.

Below the rows of light-emitting diodes are operating elements in the form of keys 5 by means of which control instruction can be issued for reducing or increasing the zonal ink feed.

Above the light-emitting diodes, superimposed digital indicating devices are provided in the form of numerical displays 6. Instead of the numerical displays 6, it is also possible to provide other optical displays, such as flashing lights or acoustic signalling devices in the form of signal horns or tickers, as described hereinafter.

FIG. 1 represents a section of the control desk 1 of the central remote-control console for the adjustment of inking zones over an area of four inking zones. By connecting lighted ones of the activated light-emitting diodes 3, there is indicated, across the width of the control desk 1, an inking profile 7 as a rough qualitative indication of the actual momentary state of inking. In the illustrated basic construction having twenty vertically oriented light-emitting diodes 3 for each inking zone display, the inking profile 7 extends from left to right through the eight, eleventh, tenth, and seventh light-emitting diodes 3. Thus, the inking profile is adequately determined.

Figure 2:
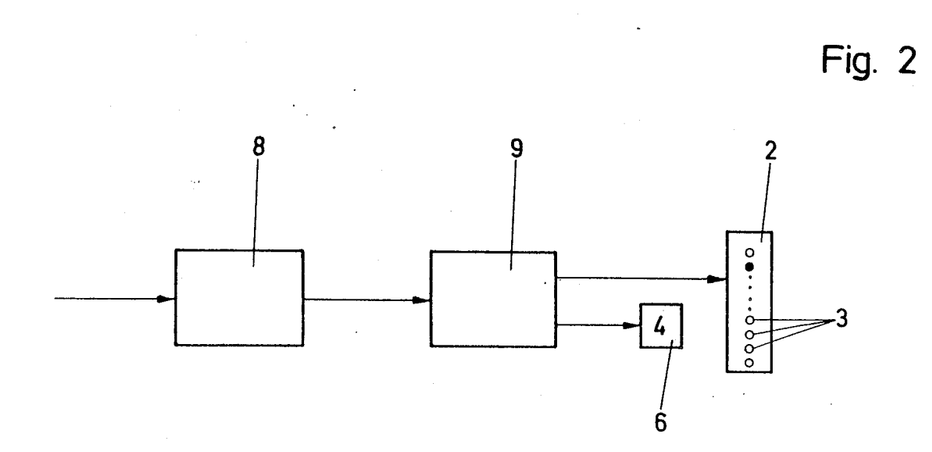
FIG. 2 a block diagram of an indicating device according to FIG. 1.

As is schematically represented in the block diagram of FIG. 2, the ink feed setting to be measured is picked up directly by a sensor 8, e.g. a generally conventional potentiometer physically connected with the ink feed member, and is fed therefrom, in the form of an analog signal, from the sensor 8 into an analog-digital signal converter 9, to which it is connected. The signal converter 9 with a decoder converts the analog value of the input signal into corresponding individual digital values which may be used for displaying the analog value on one light at the time. The display may be arranged as a rough 2, and a fine display 6 disposed parallel to one another and extending directly from the signal converter 9. The converted display signal is accordingly fed to both the rough display 2 and the fine display 6, the two displays having different degrees of resolution.

If the value of the display signal is in a range between the lower and the upper response threshold of a pair of adjacent light-emitting diodes 3, the display signal is rendered visible in the rough display by the activation of one light-emitting diode 3. The illumination of corresponding light-emitting diodes 3 in different zones provides a rough analog indication for the inking profile as described above. Depending on the degree of resolution for this display which is determined by the range between the response thresholds of the light-emitting diodes 3, this display may provide a rough indication.

It follows that the activated light-emitting diode 3 does not provide any information about the fractional values of the signal between the response thresholds of two adjacent light-emitting diodes 3. The additional fine display is used to indicate these fractional values in addition to the rough display. Accordingly, the value of the display signal which exceeds the lower response threshold of a light-emitting diode 3 is fed into the numerical display 6 and provides a fine display in digital numerals. The degree of resolution of this fine digital display may be considerably greater than that of the rough analog display for the inking profile.

In FIG. 2 the light-emitting diodes 3, as described above, indicate the coarse setting of the ink feed control members and the associated fine digital display 6 indicates, using decimal divisions that the control member for the corresponding inking zone is opened additionally, in this case, by the value of 0.4 above the numerical value associated with the ninth light-emitting diode 3, shown in full, assuming the diodes 3 are numbered 1-9.

A zero in the first numerical display 6 means that, in this case, the signal value corresponds exactly to that indicated by the ninth light-emitting diode 3, shown in full. As a rule, a single decimal place in the digital numerical display 6 is generally sufficient. The accuracy obtained thereby normally fully meets the highest demands on the printed product with respect to the inking quality thereof. Instead of the digital numerical display 6, it is also possible to employ an optically operating indicating device 6 consisting of a single light, emitting light pulses, wherein the number of pulses emitted, represents the fractional value of the display signal.

A simplification in the implementation of the indicating method is effected in an especially advantageous manner such that the light-emitting diodes 3 already employed for the rough display of the inking profile 7 are also used for the fine display by means of pulses flashing the decimal value, as described above, so that an additional display is thus completely dispensed with.

Figure 3:
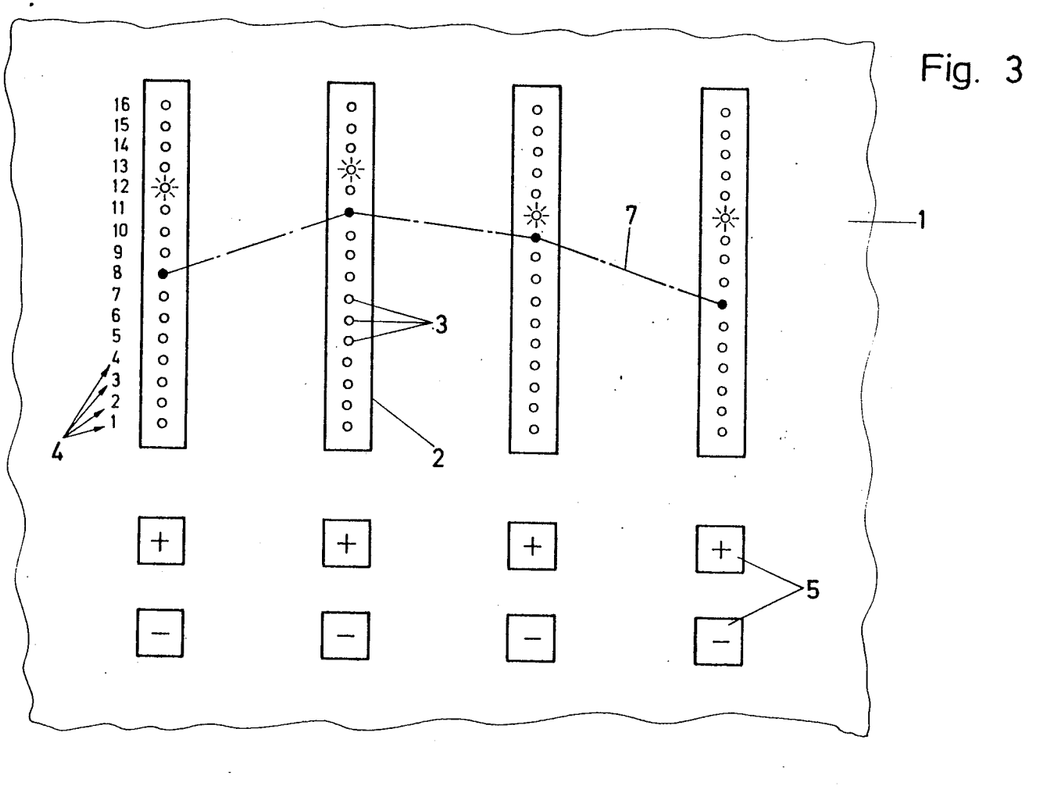
FIG. 3 is a fragmentary, diagrammatic view of a first embodiment of the indicating device.

FIG. 3 shows in a preferred embodiment having sixteen individual light-emitting diodes 3 positioned one above the other combined into vertical columns 2. As shown in this figure, the method of indication is provided such that the light-emitting diode 3 that is activated for the rough analog display of the inking profile 7 glows continuously with the same intensity, whereas another light-emitting diode 3 in the same column 2 having a different integer number e.g. 4 by flashing or by glowing more weakly provides the additional decimal information.

Thus, for example, in FIG. 3, in the first column from the left, continuous illumination of the eighth light-emitting diode 3 and flashing of the twelfth light-emitting diode indicates that the control member for the associated corresponding inking zone is opened by a value of 12/16 above the level indicated by the eighth light-emitting diode 3.

Figure 4:
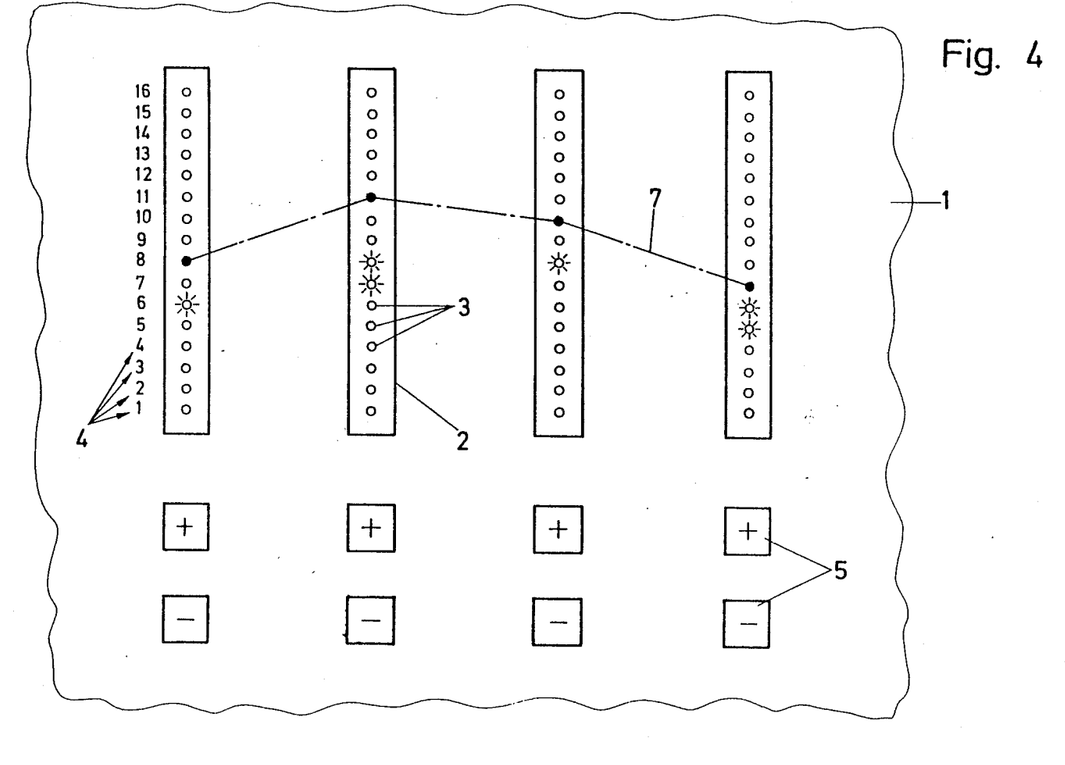
FIG. 4 is a fragmentary, diagrammatic view of a second embodiment of the indicating device.

Still another preferred embodiment shown in FIG. 4 has a similar construction as that described above and shown in FIG. 3, with respect to the provision of the rough analog display of the inking profile 7.

The essential difference between this embodiment and the former is that the degree of resolution of the fine digital display has been doubled by the possibility of activating either one or simultaneously, two consecutive light-emitting diodes 3 as shown in the second row from the left. The simultaneous flashing of two consecutive light-emitting diodes 3 additionally indicates a fractional value equal to a half increment above that indicated by the first flashing diode.

In this way, the constant illumination of the eleventh light-emitting diode 3 and simultaneous flashing of the seventh and eighth light-emitting diode 3 indicates that the control member associated with this inking zone is increased by a value of 15/32 above the response threshold of the eleventh light-emitting diode 3.

Thus, $16 \times 32 = 612$ individual settings of the control member can be indicated by activation of the sixteen light emitting diodes 3 in the manner described above. A display with such a high degree of resolution meets even the highest requirements imposed on the inking quality of a printed product.

Of course, the invention is in no way limited to the embodiments shown in the figures and described in the foregoing specification and which should merely be viewed as examples which do not restrict the invention. It is believed to be understood of itself that other embodiments with numerous modifications with respect to structural details are also conceivable, such as, for example, an increase in the display accuracy by the indication of a plurality of decimal places or by a different coloring of the light-emitting diodes 3, so that there is better differentiation between the rough and the fine display.

Figure 5:
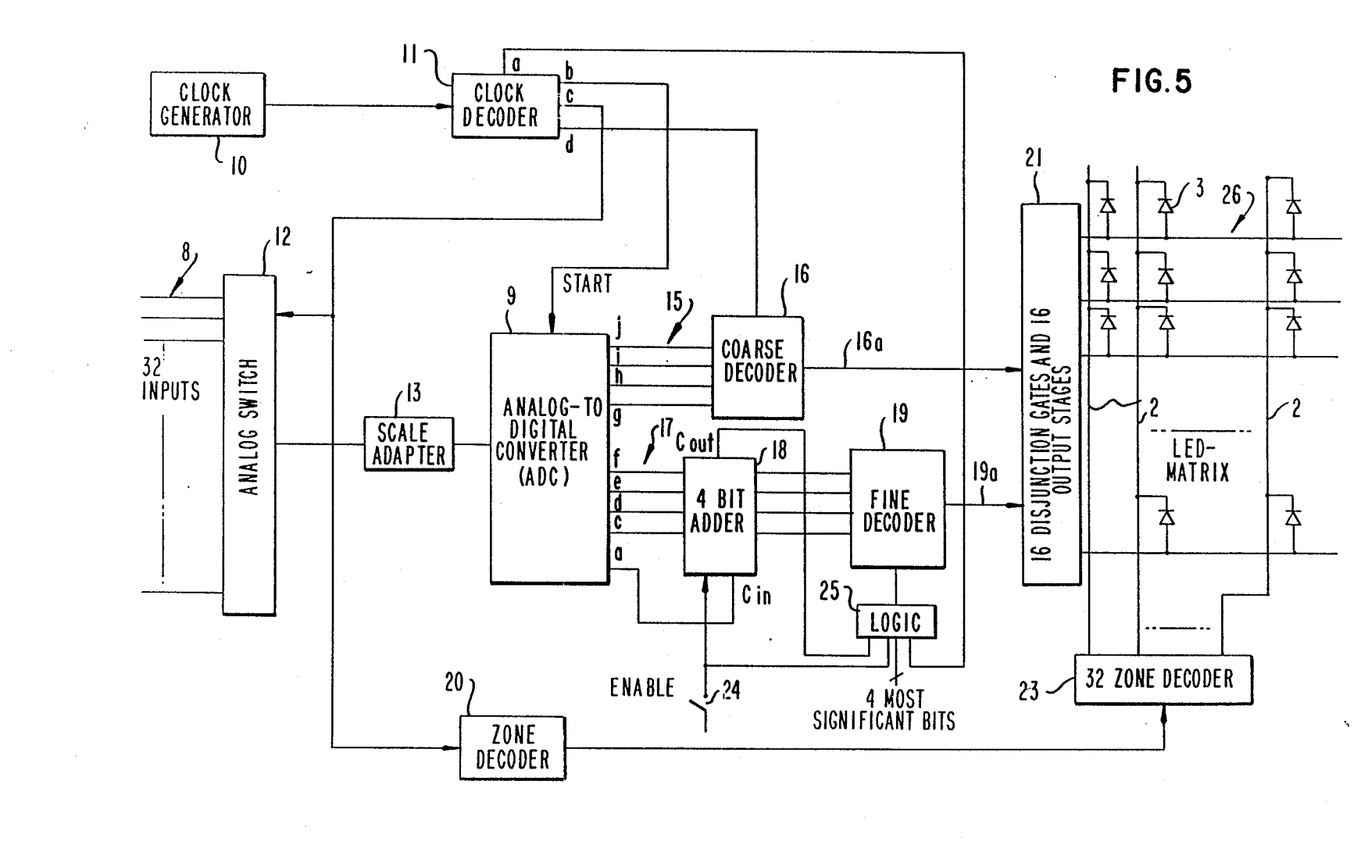
FIG. 5 is a block diagram of the control circuit arrangement of the invention.

FIG. 5 shows a block diagram of the LED display control circuit. A clock generator 10, connected to a clock decoder 11 produces all the timing, scanning and sequencing functions required for the remaining circuit. An analog switch 12 containing 32 individual switches that are activated sequentially from lead C from the clock decoder 11 operates to sequentially and periodically connect the sensor 8 (FIG. 2) for each ink zone control-member to the analog-to-digital converter (ADC) 9, through a scale adapter 13 that serves to adjust the potential coming from the 32 sensors 8, one at a time, to a voltage range suitable for the ADC 9. The ADC 9 shown in FIG. 5 has two groups of binary output leads 15 and 17, wherein 15 represent the four most significant bits (g, h, i and j) and 17 are the four least significant bits (c, d, e and f). The most significant leads 15 are connected to a 4 to 16 coarse decoder 16 with 16 individual output leads, shown as a single bus 16a, and the four least significant leads are connected through a 4-bit adder 18 to the fine decoder 19, which has 16 output leads shown as bus 19a. The coarse decoder serves to energize one of the 16 LED's in each of the 32 columns 2 of the LED matrix 22, each representing an inking zone, one, at the time in synchronism with the scanning of the corresponding 32 switches of the analog switcher 12. At the same time the 32 columns 2 are scanned in the same sequence so that each column 2 consisting of 16 LED's is activated with a negative potential at exactly the same time that the one row 26 each representing all the 32 LED's in each row is energized with a positive potential. Since each LED is essentially a diode it is well known to address one diode at the time in a matrix by simultaneous activating the row and the column with a positive and negative potential respectively. This method is also known as strobing and is widely used for electronic displays such as in calculators and many other devices. The strobing is done at such a high speed that the human eye cannot perceive the individual LED's as flashing and therefore sees the LED's as continuously lighted unless some additional lower flashing frequency is superimposed on the scanning frequency.

Figure 6:
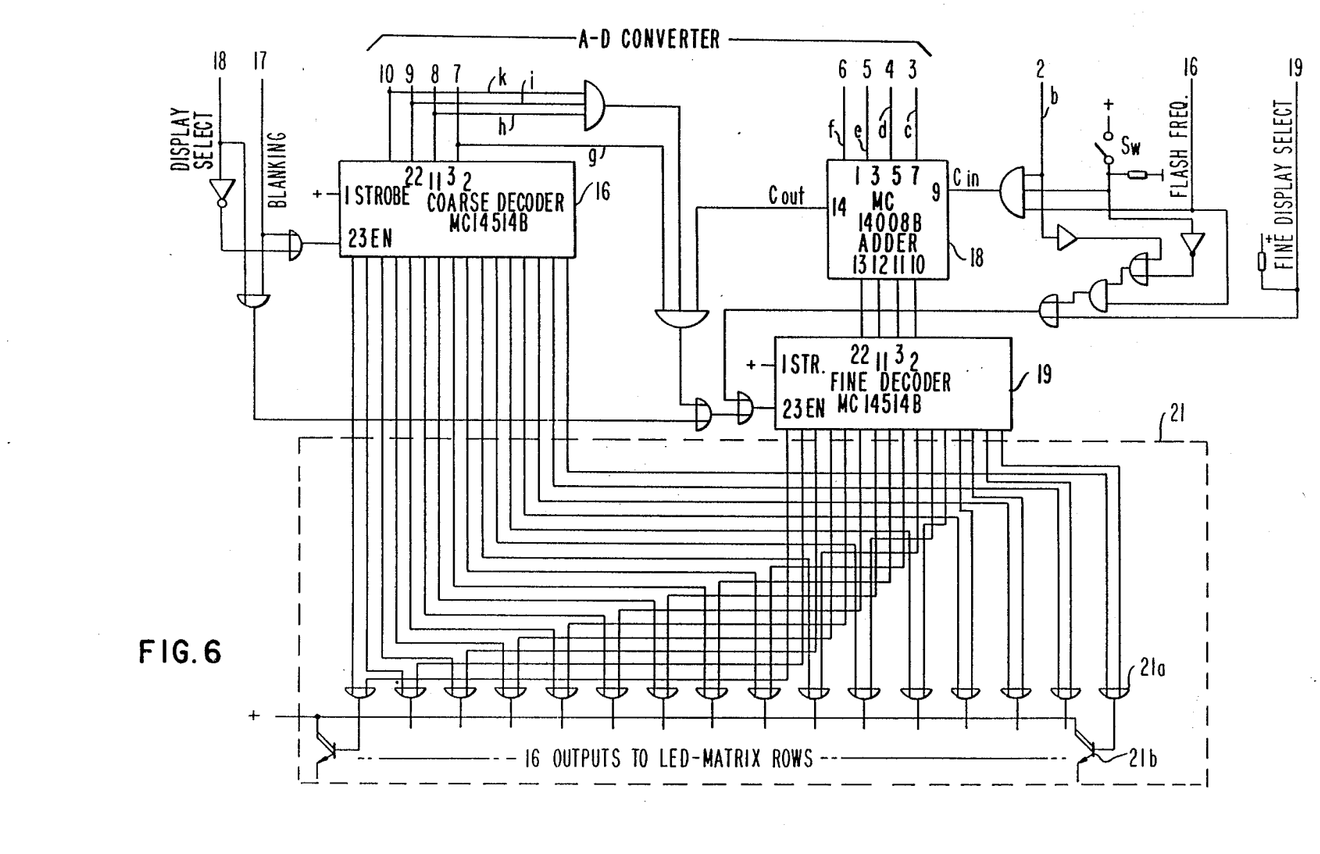
FIG. 6 is a block diagram of the LED gating and control arrangement.

The 16 disjunction gates 21 consist of 16 row drivers for the matrix 22, and is drawn in more detail in the dashed box 21 of FIG. 6. Each driver is driven by a two input OR-gate 21a, each driving a row driver 21b which produces at its output lead a positive potential if one of the OR-gate inputs is energized. One input to all the 16 OR gates is connected to 16 outputs from the coarse decoder 16 (FIG. 6), while the other input is connected to the fine decoder 19. Additional control circuitry and components shown in FIG. 6, that are conventional, operate to enable the two decoders 16 and 19 in the proper synchronism required for the LED display such that the coarse decoders produce an output that makes the coarse indication appear as constantly lighted and the fine display as flashing at some suitable, visible rate, such as 30 interruptions per minute or the like.

An Enable switch is connected to the four bit adder 18 and to the fine decoder 19 via logic 25, via lead 24.

Since the strobing of LED type displays is conventional, and the invention is not directed to strobing of LED displays, per se, the details of the various timing circuits need not be described, other than that a flashing frequency on lead 16 at the upper right hand corner of FIG. 6 applies the flashing cadence through logic gates to inhibit input 23 (EN) of the fine decoder 19, so that the fine decoder indicates by means of a flashing LED.

Figure 7:
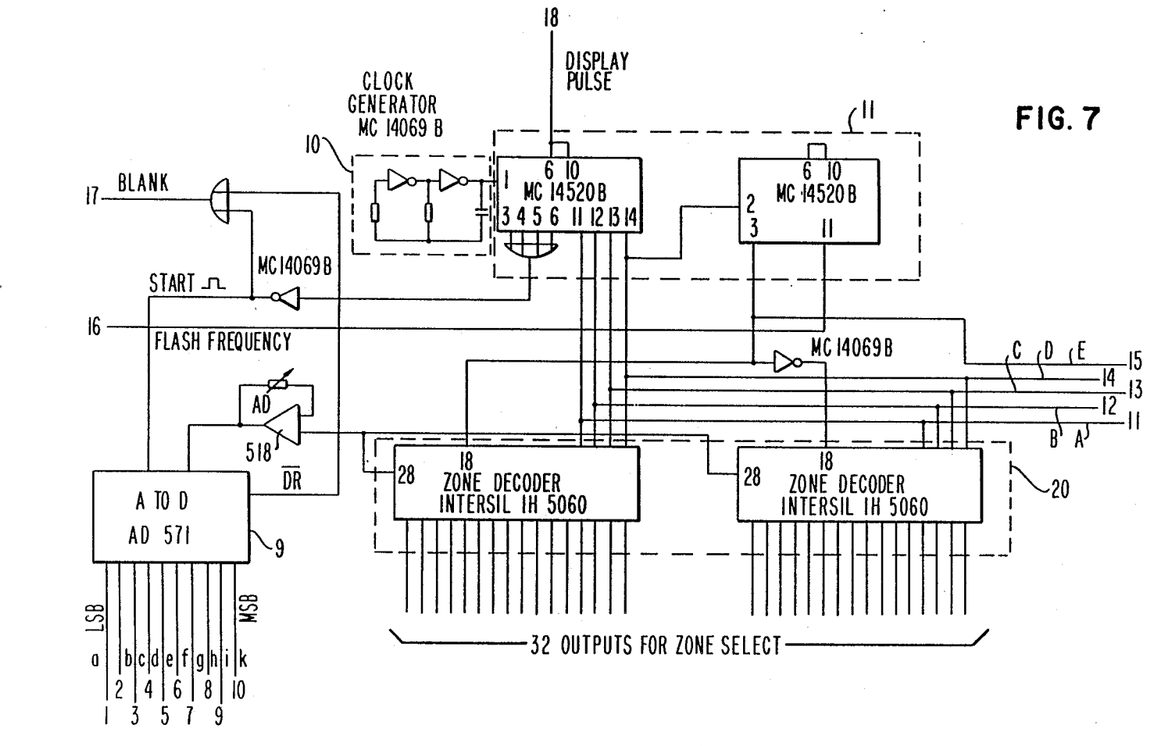
FIG. 7 is a circuit diagram showing the clock pulse generator and the clock decoder in greater detail.
Figure 8:
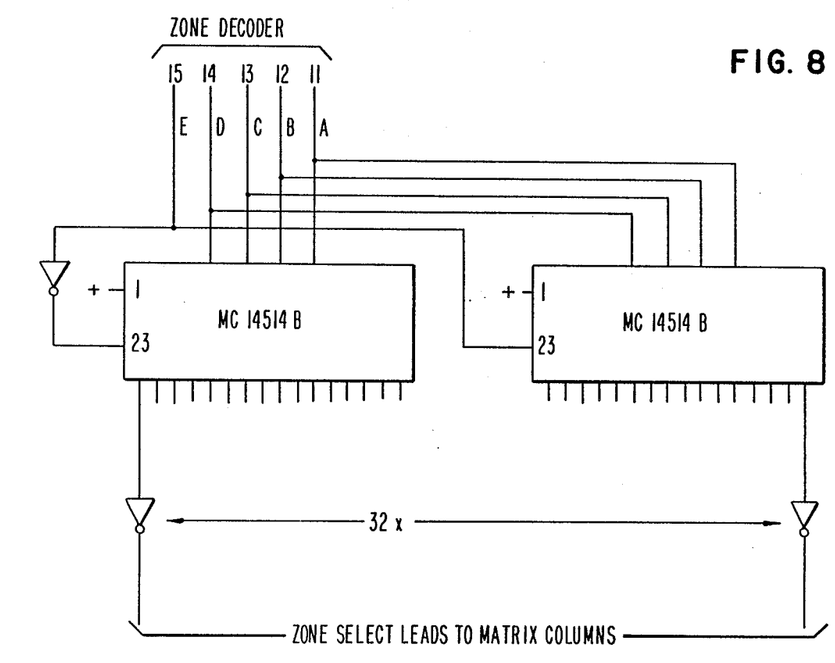
FIG. 8 is a circuit diagram showing the zone decoder in greater detail.

FIG. 7 shows details of the clock pulse generator 10 and the clock decoder 11 which in turn drives the zone decoder 20 and produces 32 individual zone select pulses, which periodically sequentially enable each of the 32 columns 2 of the LED matrix 22, as described in detail above. Details of the zone decoder are shown in FIG. 8.

Returning now briefly to FIG. 5, the zone decoder 20 is seen driven by the clock decoder output lead c. The zone decoder 20 advances by a count of one each time a complete reading of the 32 analog switches has been completed by the ADC 9 and decoded by the coarse decoder 16 and the fine decoder 19, and displayed for a finite length of time by the selected LED at the matrix crosspoint of the selected row and selected inking zone column. In order to accommodate the mode of operation wherein two flashing diodes are provided in each column for additional resolution as described above, a four bit adder 18 and a logic circuit 25 is shown connected to the fine decoder 19 for operating the second flashing LED in one column. In this case, the additional half increment is enabled by the lead a from the ADC 9 which is connected to a carry-in lead (C in) of the four bit adder 18. This additional half increment is now indicated by the carry-in by raising the binary output from the four bit adder 18 to the fine decoder 19, which, as a result enables the next higher numbered output lead of the 16 leads comprising the bus 19a from the fine decoder 19 to the 16 disjunction gates 21. The logic circuit 25 is driven from a carry out lead (C out) from the four bit adder 18 so that, in case an output carry is created by the binary number received on leads 17 and the presence of a carry in result in a carry out, the output from the fine decoder is raised by still another increment. The circuits involved in these operations are all well known and conventional. Four bit adders with carry in and carry out are known as full adders and are manufactured by Motorola Co. as MC 14008B and the decoders may be Motorola circuits MC 14514B or any other similar, suitable circuit.

We claim:

1. Display system for indicating, at a central remote-control location, settings of ink feed for a printing press having a plurality of M ink zones, each ink zone having an adjustable ink zone control member coupled to an ink zone sensor for producing a sensor signal representing a setting value for said settings; the display system comprising a plurality of light indicators arranged as a matrix consisting of a plurality of N rows and a plurality of M columns, each column consisting of N consecutively numbered light indicators ranging from numbers 1 to N, wherein N and M represent positive integer numbers, each of said indicators disposed at a respective crosspoint between a row and a column; said plurality of columns corresponding to and being equal to the plurality of ink zones and the plurality of rows corresponding to and being equal to the plurality of settings; means for producing a coarse setting value signal and a fine setting value signal from said sensor signal for each respective ink zone, means for lighting one light indicator in each column to indicate by its number a respective one of N coarse setting values, and means for simultaneously contrastingly lighting in the same column another light indicator to indicate by its number a respective one of N fine setting values of said control member.

2. Display system according to claim 1, including: an analog-digital converter connected to said ink zone sensor, a clock generator, a coarse decoder interposed between said matrix and the analog-digital converter for producing said coarse setting value signal and a fine decoder interposed between said analog-digital converter and said matrix for producing said fine setting value signal, said fine decoder being responsive to said clock generator to produce flashing of said other light indicator.

3. Display system according to claim 2 including:
a plurality of disjunction gates responsive to said coarse decoder and to said fine decoder, having respective outputs, each of said outputs operating to enable a respective matrix row, zone drivers responsive to said clock generator, having respective outputs connected to respective columns of said matrix and operating to sequentially, periodically enable one column at the time in said matrix in timed relation with the output of said disjunction gates to light the respective light indicator defined by the crosspoint of said enabled row and said enabled column, said light indicator indicating the setting value of the ink zone control member corresponding to said enabled row.

4. Display system according to claim 3 including a zone decoder connected between said zone drivers and said clock generator and operatively engaging said zone drivers to activate said respective zone driver outputs.

5. Display system according to claim 1 wherein said light indicators are light-emitting diodes.

6. Display system according to claim 1 wherein a difference between two consecutive setting values represent a fine increment, and including a further light indicator in said column for producing a still finer display being equal to one-half of said increment of said fine setting value, said further light indicator disposed adjacent said other light indicator.

7. Display system according to claim 1 wherein said one lighted light indicator is lighted at a continuous glow and said second light indicator is flashing.

8. Display system according to claim 1 wherein said one lighted light indicator is lighted at a continuous glow and said other light indicator is lighted at a more weakly glow.

9. Method for displaying adjustment values for remote-controlled control members for adjusting at least one of a plurality of zones of ink and a plurality of zones of dampening fluid supply from a remote-control location of a rotary printing machine, having an electrical position signal returned from each control member, representing a position value for said control member; a plurality of consecutively numbered light-emitting diodes arranged as columns, each column representing a respective zone for receiving a respective position signal; each light-emitting diode within each column representing a respective position value, the method comprising the steps of: dividing said position signal into a coarse and a fine position signal; simultaneously displaying said coarse and said fine position signal for each control member on the respective column of light-emitting diodes as a coarse display and a fine display, wherein said one light-emitting diode within one column serves to display the coarse position value, and another light-emitting diode serves to display the fine position value; and a still finer position value is displayed by the light-emitting diode immediately above the diode displaying the coarse value and a not displayed value represented by the next higher light-emitting diode.

10. Method according to claim 9 comprising the steps of: displaying the coarse position value by a continuously illuminating light-emitting diode; and displaying simultaneously the fine position value by a flashing light-emitting diode.

11. Method according to claim 9 comprising the steps of: displaying the coarse position value by a continuously illuminating light-emitting diode; and displaying the still finer position value by means of two adjacent flashing light-emitting diodes in the same column of light-emitting diodes.

12. Method according to claim 11 comprising the steps of forming a coarse position value increment as the difference in coarse position values represented by two adjacent light-emitting diodes in one column; and forming a fine position value increment which is equal to the coarse position value increment divided by the total number of light-emitting diodes in one column.

13. Method according to claim 11 comprising the steps of: forming a coarse position value increment as the difference in coarse position values represented by two adjacent light-emitting diodes in one column; and forming a fine position value increment by dividing a coarse position value increment by ten.

14. Method according to claim 11 comprising the step of: forming said still finer display by simultaneously illuminating at least two adjacent diodes in one column.

15. Display system for indicating, at a central remote control location, settings of dampening fluid feed for a printing press having a plurality of M dampening fluid zones, each dampening fluid zone having an adjustable dampening fluid zone control member coupled to a dampening fluid zone sensor for producing a sensor signal representing a setting value for said settings; the display system comprising a plurality of light indicators arranged as a matrix consisting of a plurality of N rows and a plurality of M columns each column consisting of sequentially numbered light indicators ranging from numbers 1 to N, wherein N and M represent positive integer numbers, each of said indicators disposed at a respective crosspoint between a row and a column; said plurality of columns corresponding to and being equal to the plurality of dampening fluid zones and the plurality of rows corresponding to and being equal to the plurality of settings; means for producing a coarse setting value signal and a fine setting value signal from said sensor signal for each respective dampening fluid zone, means for lighting one light indicator in each column to indicate by its number a respective coarse setting value, and means for simultaneously contrastingly lighting, in a manner contrasting with a lighting of said one indicator, in the same column another light indicator to indicate a respective fine setting value of said dampening fluid zone control member.

16. Display system according to claim 15 wherein said light indicators are light-emitting diodes.

17. Display system according to claim 15 wherein the difference between two consecutive fine setting values represent a fine increment, and including a further light indicator in said column for producing a still finer display being equal to one-half of said increment of said fine setting value, said further light indicator disposed adjacent said other light indicator.

18. Display system according to claim 15 wherein said one lighted light indicator is lighted at a continuous glow and said other light indicator is flashing.

* * * * *